United States Patent [19]

Rosso

[11] Patent Number: 4,539,523
[45] Date of Patent: Sep. 3, 1985

[54] FREQUENCY TO VOLTAGE CONVERTER FOR A PREDETERMINED FREQUENCY RANGE

[75] Inventor: John B. Rosso, Tulsa, Okla.

[73] Assignee: Combustion Engineering, Inc., Windsor, Conn.

[21] Appl. No.: 501,683

[22] Filed: Jun. 6, 1983

[51] Int. Cl.$^3$ .......................... H03K 9/06; H03K 5/26
[52] U.S. Cl. .................................. 328/141; 307/523; 307/234; 307/519
[58] Field of Search ................ 307/234, 265, 522, 523, 307/519; 328/134, 138, 141

[56] References Cited

U.S. PATENT DOCUMENTS 3,742,299 6/1973 Gane ........................................ 317/5
3,753,130 8/1973 Pezzutti ................................ 328/141

Primary Examiner—John S. Heyman
Attorney, Agent, or Firm—Arthur L. Wade

[57] ABSTRACT

An electronic circuit receives an input of voltage pulses whose frequency of a predetermined range represents a variable to be manifested. The first train of pulses of varying frequency is applied to a one-shot monostable multivibrator which produces a second train of pulses, each of which has a duration representative of the maximum frequency of the predetermined range. The output of the one-shot controls a gate through which passes a third train of pulses of constant frequency and shape between the pulses of the second train. Counting, latch, and analog circuits respond to the third train of pulses to manifest the frequency of the first pulse train within its predetermined range.

5 Claims, 1 Drawing Figure

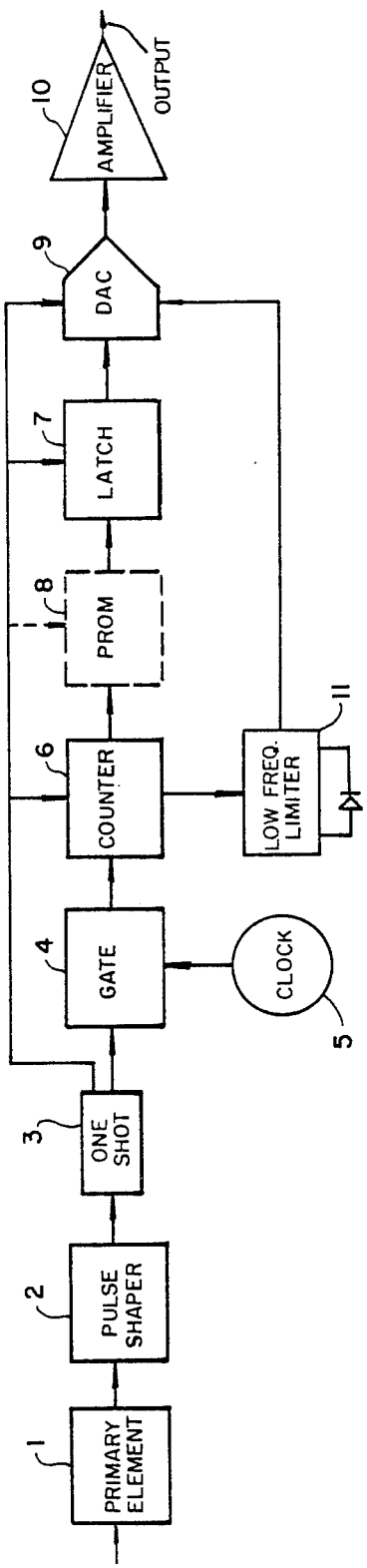

FREQUENCY TO VOLTAGE CONVERTER FOR A PREDETERMINED FREQUENCY RANGE

TECHNICAL FIELD

The present invention relates to the extraction of information as represented by the frequency of periodic electrical signals generated by a physical state. More particularly, the invention relates to the translation of the frequency of voltage pulses in a train generated by a variable condition.

BACKGROUND ART

This disclosure raises the curtain on the world of voltage pulse manipulation. There are a genre of primary elements placed to directly respond to changing physical states, exemplified by temperature, pressure, flow, and composition. These primary elements generate electrical voltage pulses at frequencies representative of variations in these physical states.

Narrowing attention to the frequency of these pulses, a predetermined range of their frequency can be analyzed and translated into signals which can manifest the instantaneous magnitude of the state and/or exert control over the change desired in that state. Perhaps more succinctly declared, if provided with a meaningful range of frequency, I can produce a meaningful translation of that range into a useful signal.

In the present art, voltage variations are simply referred to as pulses. The excursion of the voltage can vary in its magnitude and duration. In reaching its greatest magnitude, the pulse may have a first irregular growth rate from which it may decay at a second irregular rate. The irregularity of growth and decay rates reflects the subjective characteristic of the primary element generating the pulses. The first step in manipulating this train of pulses into useful form is to shape them into uniformity, particularly giving them a sharp actuating edge which may be either the leading, trailing, or both edges. Thus, the raw train of pulses discharged by many primary elements directly responsive to the physical state, are passed through a shaping circuit to provide a sharp edge to each pulse and thereby a precise measurement for the time between the pulses. This time, of course, is the frequency at which the pulses appear in the train.

Given a pulse train with meaningful variations in frequency, and given a circuit shaping the pulses to a uniform pattern, there is need for a circuit which will precisely sense the variation in the frequency of the pulses and ultimately produce a signal which is an interpretation of that frequency variation. The train of shaped pulses is fed as an input into a one-shot monostable multivibrator. The actuating edge of each input pulse triggers a corresponding output pulse from the one-shot. Each output pulse from the one-shot is adjusted to a predetermined duration corresponding to the maximum range of the frequency variation of the shaped input pulses. Thereafter, a decrease in the frequency of the primary pulse train to the one-shot within the predetermined range will create a time interval between the one-shot triggered output pulses. Perhaps more succinctly stated, the output of the one-shot becomes the time intervals between the triggered pulses of the one-shot, these time intervals representing frequencies within the predetermined range.

The intervals between the one-shot output pulses can then be placed in control of a third train of pulses of stable frequency. The pulses of the third train, with their stable frequency, are discharged during the variable intervals between the one-shot output pulses. A count of the number of third train pulses emitted between the one-shot pulses will represent the frequency of the first pulse train. There remains only the need to store and convert the third train pulses into a useful signal with which to manifest the frequency of the first train pulses and control the state that generates the first pulse train.

DISCLOSURE OF THE INVENTION

The present invention contemplates a source of a first train of raw voltage pulses whose frequency represents the physical state to be manifested. A circuit is provided to shape the raw pulses of the first train into uniformity, and ensuring a sharp actuating edge for each pulse. Each pulse of the second train is triggered by the sharp actuating edge of the first train pulse for a duration equal to the maximum frequency of the first pulse train. A source for a third train of pulses having a stable frequency is controlled by the intervals between the pulses of the second train to emit the number of third train pulses corresponding to the duration of the interval between the pulses of the second train. A counter is connected to the source of the third pulse train to receive and register each group of third train pulses as representative of the frequency of the first pulse train.

The invention further contemplates a storage or latch circuit connected to the counter to receive each group of third train pulses registered by the counter and controlled by connection to the trigger circuit to discharge each counted group of third train pulses to an analog circuit.

Other objects, advantages and features of this invention will become apparent to one skilled in the art upon consideration of the written specification, appended claims, and attached drawing.

BRIEF DESIGNATION OF THE DRAWING

The drawing is a block diagram disclosing the system which embodies the present invention.

BEST MODE FOR CARRYING OUT THE INVENTION

An Overview

When it is considered that the invention is embodied in the arrangement of individual pieces of equipment which are readily available in the prior art, detailed descriptions of the arrangement and function of this equipment would only be tantamount to clouding the essential elements of the invention. Necessarily, the disclosure begins with the primary element with which the raw pulses of the first train are generated. In reducing the invention to practice, the applicant was stimulated by the primary element which was a mechanically vibrated U-tube through which fluids were flowed. Vibration of the U-tube, while fluid was passed through it, caused a change in the period of the frequency of the U-tube which generated the first train of voltage pulses. It was exciting to note that the change in frequency of the U-tube vibrations was related to the density of the fluid flowing through the U-tube. Therefore, the frequency of the voltage pulses was observed as representative of the ratio of two fluids forming the mixture flowing through the U-tube. The immediate application visualized was an instrument to determine the oil-water mixture sample routed through the U-tube.

Although the primary element U-tube is represented in the drawing as a black box, it symbolizes any primary element which responds to a state or condition whose change causes variation in the frequency of a first train of voltage pulses discharged by the primary element. The present inventive concept is not limited to a form of primary element, any primary element which provides an output of raw voltage pulses whose frequency variation has a predetermined relationship with a physical state or condition to be manifested and/or controlled, provides the input to the present invention. The primary element which discharges a first train of voltage pulses is the first element of the inventive combination.

Having clearly established the origin of the first train of voltage pulses, the processing begins by shaping each of the pulses, cramming them into a mold which will ensure that they have a sharp leading and/or trailing edge with which to actuate a one-shot. If the primary element were developed to provide these pulses for the first train with the required form, a separate circuit to shape them would not be needed. However, it is customary to provide a separate circuit designed specifically to process the raw pulses. Such shaping circuit can only be considered adjunct to those elements embodying the invention. In all events, the first train of pulses is fed as an input to the one-shot.

The one-shot is a well-known circuit. Essentially, it produces an output pulse of predetermined duration and magnitude when actuated by the leading and/or trailing edge of an input pulse of the first train. The result is a second train of triggered pulses. The essence of the invention is in the deliberate establishment of a train of triggered pulses wherein each pulse has a predetermined duration equal to a predetermined maximum frequency between pulses of the first train.

Now, the disclosure of the invention emerges. With the second train of triggered pulses having a consistent duration equal to the period of the maximum frequency of the predetermined range of the pulses of the first train, any lesser frequency in the first train will appear as gaps between the pulses of the second train. The duration or length of this gap represents the frequency of the first train less than its maximum.

No analysis of electrical circuits producing the two pulse trains or their form and duration is required to understand the invention. The circuit arrangements and their adjustments to provide these features of the pulses of both trains are well-known. But the setting of the duration of the triggered pulses of the second train to provide intervals between the triggered pulses as representative of a frequency less than the predetermined maximum for the first train is novel. There remains only the development of a useful signal to be controlled by these "off" times of variable duration between the pulses of the second train.

A circuit to generate a train of pulses with precise shapes and intervals between them is well-known. In the terminology of this art, such circuit is referred to as a "clock". A clock circuit is connected to a gate so that its discharge of a third train of pulses having unvariable shapes and frequency will pass through the gate under control of the second train of triggered pulses. It is well understood in the art how such arrangement is feasible to pass the clock pulses only during the intervals between the triggered pulses of the second train. The frequency of the pulses of the third train can be established so that a predetermined large number of these pulses will be discharged through the gate as an output during the intervals of the third train. The pulses are so great in number that it is logical to refer to them as "bursts" of pulses, but regardless of their multiplicity, a counter circuit can readily register them as a word in a binary system. Therefore, the number of clock pulses of the third train can be counted as a magnitude representative of frequency which establishes the interval between the triggered pulses of the second train.

The combination of the calibrated one-shot circuit receiving the first train of pulses, the clock and gate cooperating to feed a counter with the burst of the third train, embodies the present invention. The remaining structure is adjunct to this essential combination. The binary counter receiving the third train of pulses from the gate has a familiar function in the art. The binary counter is connected to a latch or storage circuit to which is passed each burst of counted third train pulses. The latch can be actuated by a connection to the one-shot to establish the stored burst of third train pulses as an input to a digital-to-analog circuit. Of course, once the analog voltage is produced, the signal may be utilized in control. Simultaneously, or alternatively, the latch burst may be read directly as a manifestation of the burst of the third train as the frequency of the first train. No amount of detailed description of each individual circuit and device between the primary element and the counter, latch or analog will disclose the invention more clearly.

The Black Boxes Of The Drawing

The black box convention of the drawing will be adequate to disclose the invention embodied therein. Primary element 1 generates the initial first train of raw voltage pulses. If imagination requires, this primary element 1 can be inferred as plucked from the disclosure of Smith U.S. Pat. No. 4,105,524, Aug. 29, 1978. Only representative of any primary element which generates a first train of pulses whose frequency has a range of interest, this particular mechanism is that stimulating the present inventor to develop the present invention to process the frequencies of the first train of pulses.

Referring again to the drawing, the output of primary element 1 is the input to shaper circuit 2. As previously described, the shaper circuit simply gives the voltage pulses of the first train sharp actuating edges and a consistent width and height, the better to trigger the one-shot monostable multivibrator 3. The pulses could be represented in the first train as it becomes an input to one-shot 3, but this is deemed unnecessary to understanding. What must be clearly understood is that each sharp edged voltage pulse of the first train triggers one-shot 3 to produce what can only be termed as an output pulse.

The output pulses of one-shot 3 are precise in their dimensions, particularly their duration in forming the second train. Further, the duration of these triggered pulses of the second train can be set by adjustment within the circuit of one-shot 3 to precisely represent the period of the maximum frequency of a predetermined range of interest in the first train of pulses. The result, now perhaps with monotonous repetition, is to produce a triggered output from one-shot 3 as an input to gate 4 which will keep gate 4 closed for as long as the triggered pulses of the one-shot 3 output abut each other in train 2, i.e. a continuous pulse. The trick is to recall that the continuous, constant output pulse of one-shot 3 is actually a series of pulses although they abut each other precisely at the period of the maximum frequency of the predetermined range. Therefore, any frequency less than the maximum will be evidenced by a gap between the pulses of the second train, these gaps representing a duration of time in which gate 4 will be open.

Admittedly, the description of the electronic circuit draws heavily on mechanical engineering terms. Nevertheless, it is well-understood by all those skilled in the art that gate 4 has a third train of pulses fed to it from clock 5. Pulses from clock 5 are extremely precise in dimension and produced at an extremely constant rate. In effect, these clock pulses knock on the input to gate 4 to be passed through gate 4 whenever it is opened by a lapse between the triggered pulses of train 2. This arrangement and function of one-shot 3, gate 4, and clock 5 is the heart of the invention. The clock pulses which spill through gate 4 between the triggered pulses controlling the gate, represent the frequency of the pulses of train 1 less than the maximum frequency of the range of interest. To some extent, the remainder of the disclosure of the block drawing is commentary. The burst of clock pulses which are passed by gate 4 are received by an electronic counter 6 which may have any number of bits necessary to refining the counter word.

It is a well-known practice to pass the digital signal of counter 6 into a latch 7 at the end of each counting cycle. The end of each counting cycle may be controlled from the one-shot 3. This control is well-known to reset the counter after it has accumulated the clocked pulses and passed them to latch 7. Such control is symbolized by the lines established between the black boxes.

The readout of counter 6 may be refined and utilized in any number of well-known ways. The Program Read Only Memory (PROM) circuit 8 may be interposed between counter 6 and latch 7 to give any required characterization to the variation of the output of the counter as desired to analyze the frequency of the first train pulses. The frequency reading in latch 7 may be passed to a computer circuit in digital form, or which may be used to control a digital-to-analog converter 9 to establish an output in the form of a D.C. voltage. This analog signal output of converter 9 may be amplified as symbolized at 10. The output from amplifier 10, of course, can be used to control the condition or state which originally caused generation of the first train of pulses by primary element 1.

Also, ancillary to the production of the useful signal representing frequency variations of the first train pulses, is a low frequency limiter 11 which can be connected as indicated to take its signal from counter 6 and terminate a subsequent signal such as produced by analog converter 9 when the lower limit of the frequency of the range of interest is reached. To indicate the disability of visual manifestation of the low frequency limit, a light is indicated on the block.

In summation, attention is to be reconcentrated upon the interrelationship between one-shot 3, gate 4 and clock 5. Very simply, the adjustment of the duration of the triggered pulses of the second train from one-shot 3 establishes the upper frequency of a predetermined range of first train frequencies. Once this triggered pulse duration output on the one-shot 3 is established, a batch of clocked pulses is produced through gate 4, each number of pulses within each batch representing a frequency of train 2 pulses within their predetermined range. Specific values of frequency, voltage, pulse durations, etc. have been omitted. It is felt that one skilled in the art does not need specific values to practice the invention as disclosed.

From the foregoing, it will be seen that this invention is one well adapted to attain all of the ends and objects hereinabove set forth, together with other advantages which are obvious and inherent to the apparatus.

It will be understood that certain features and subcombinations are of utility and may be employed without reference to other features and subcombinations. This is contemplated by and is within the scope of the invention.

As many possible embodiments may be made of the invention without departing from the scope thereof, it is to be understood that all matter herein set forth or shown in the accompanying drawings is to be interpreted in an illustrative and not in a limiting sense.

I claim:

1. A circuit responsive to a predetermined range of electrical pulse frequencies, including, a primary element responding to a physical state by generating a first train of electrical pulses whose variation in frequency represents changes in the physical state, a shaper circuit receiving the first train of electrical pulses and outputting each pulse with at least one sharp actuating edge, a one-shot monostable multivibrator connected to the shaper circuit to receive the first train of pulses and apply the sharp actuating edge of each pulse to produce a second train of electrical pulses with each pulse having a duration equal to the period of the maximum frequency of the first train pulses, a gate connected to the one-shot to receive the second train of pulses with intervals between the pulses of the second train representing those frequencies of the first train pulses less than their maximum frequency, a source generating a third train of pulses connected to the gate in an arrangement whereby the output of the gate is the third train of pulses of stable frequency during the intervals between pulses of the second train, a binary counter connected to the gate to receive each group of stable pulses passed by the gate and convert each group into a binary word, and means connected to the binary counter to convert each word into a manifestation of the frequency represented by the word.

2. A circuit for converting the frequencies of a train of electrical voltage pulses to a D.C. analog voltage, including, a source responding to a varying physical state by generating a first train of electrical voltage pulses having a frequency of predetermined range, a triggering circuit connected to the source of the first train of electrical voltage pulses to receive and cause each pulse of the first train to trigger an output pulse having a duration equal to the period of the highest frequency of the range of the first train pulses in forming a second train of triggered output pulses, an electronic gate connected to the circuit to receive the second train of triggered pulses and responding to remain closed during the duration of each triggered pulse, an independent source generating a third train of pulses of stable frequency and connected to the electronic gate as an input and passing through the gate when the gate is open during the intervals between the triggered pulses of the second train of pulses, a counter connected to the electronic gate output to count the pulses of the third train passed by the gate, and means connected to the counter establishing an analog voltage whose magnitude represents the number of pulses in each group of pulses of the third train passed by the electronic gate when the gate is opened between triggered pulses, whereby the analog magnitude signal represents the frequency of the pulses of the first train within their predetermined range.

3. The circuit of claim 2, including, a shaper circuit connected to the source of the first train of pulses and the triggering circuit to sharpen at least one actuating edge of each pulse of the first train of pulses.

4. The circuit of claim 3, wherein, the triggering circuit triggered by the sharp actuating edge of the pulses of the first train is a one-shot monostable multivibrator.

5. The circuit of claim 4, wherein, the counter receiving the pulses of the third train is a binary counter connected to feed a word to a latch controlled by connection to the one-shot, and a digital-to-analog converter is connected to the latch to convert the word in the latch into the analog voltage.

* * * * *